United States Patent [19]
Grimes et al.

[11] Patent Number: 4,672,299
[45] Date of Patent: Jun. 9, 1987

[54] CLOCK CONTROL CIRCUIT FOR PHASE CONTROL

[75] Inventors: Gary J. Grimes, Thornton, Colo.; Christopher Lanzafame, West End; Bryan S. Moffitt, Red Bank, both of N.J.

[73] Assignees: American Telephone and Telegraph Co., New York, N.Y.; AT&T Information Systems, Inc., Morristown, N.J.

[21] Appl. No.: 866,374

[22] Filed: May 23, 1986

[51] Int. Cl.[4] .............................................. H03L 7/06
[52] U.S. Cl. .................................. 323/217; 364/484; 364/486; 375/111; 455/260; 455/265; 307/269; 307/511
[58] Field of Search ................ 323/217; 307/231, 269, 307/510, 511, 87; 331/DIG. 2; 328/155; 364/481, 484, 486, 487, 607, 851; 375/111, 118–120; 455/260, 265

[56] References Cited
U.S. PATENT DOCUMENTS

| | | | |
|---|---|---|---|
| 4,414,639 | 11/1983 | Talambrias | 307/269 X |
| 4,464,771 | 8/1984 | Sorenson | 307/269 X |
| 4,495,473 | 1/1985 | Treise | 455/260 X |
| 4,521,744 | 6/1985 | Yamada et al. | 455/260 X |

Primary Examiner—Patrick R. Salce
Assistant Examiner—Emanuel Todd Voeltz
Attorney, Agent, or Firm—David H. Tannenbaum

[57] ABSTRACT

There is disclosed a clock circuit for a PBX system that uses phase locked loop technology to perform synchronization between two input signals. The system can switch between different reference sources without introducing error and without requiring the entire circuit to become realigned with the phase of the newly selected reference signal. This is accomplished with a phase build-out circuit that uses a phase locked loop divider to change the phase of the internal control signal to match the phase of the newly selected reference thereby eliminating timing changes on the system clock bus. The system can also be used to change between redundant clock circuits.

11 Claims, 4 Drawing Figures

CLOCK CONTROL CIRCUIT FOR PHASE CONTROL

BACKGROUND OF THE INVENTION

This invention relates to a circuit for allowing a phase sensitive circuit to switch between different reference signals and more particularly to such a circuit which operates without requiring separate input phase locked loops.

The problem of controlling phase sensitive circuits when switching between different input reference signals, even when the signals have the same frequency, is well-known. The problem arises from the possible phase difference between the signals. Thus, when a switch is made to the "other" reference input and that input is even slightly out of phase with the "original" reference input, circuitry of the main circuit detects the difference and immediately readjusts the main circuit to be in synchronization with the new input. At best this is disruptive to the operation of the circuit. When the main circuit provides reference signals for subsequent data transfer, as in a PBX, severe data errors occur with each such switch of reference inputs.

Typically, the problem is overcome by forcing the input signals to have the same phase. This is accomplished by using phase locked loop circuitry on each input to keep them in synchronization with each other. This approach is cumbersome, in terms of physical space required for all the components, and costly, in terms of component cost. This problem escalates rapidly when it is desired to switch between several reference input signals since, for each such input, an entire phase correction circuit is required

SUMMARY OF THE INVENTION

These and other problems have been solved by a clock circuit which provides a stabilized output data clock signal as well as synchronization between various reference input signals. The input signals can be either external reference signals, for the case of slave timing, or a local reference oscillator. In the normal operate mode, the clock circuit maintains the circuit stabilized with respect to the input reference signal. This is accomplished by establishing a phase locked loop with respect to the reference input and the desired output. During a switch between input signals, when the phase between the "old" input signal and "new" input signal (assuming the same frequency) could be different, the clock circuit goes into a change-over mode and operates as a phase build-out circuit. In this mode, the clock circuit forces the phase locked loop divider to match the loop phase to the phase of the newly selected reference. In this manner, since the output of the phase locked loop circuits is forced to be in synchronization, at least for a finite time during the transition between the "old" reference and the "new" reference, the main control circuit for the output clock signal sees no change in phase and, thus, continues without in any way affecting the output clock signal.

Our clock circuit is also arranged with a third, or back-up, mode operable to control switches between clock circuits. This is accomplished by forcing the output of the phase build-out circuit of the "hot spare" to effectively follow a system frame signal which is, in turn, driven by the active clock circuit. Thus, the back-up clock circuit is forced to be in phase with the active clock circuit. When the back-up clock circuit becomes the active clock circuit, the roles are reversed and the old back-up clock circuit then follows the phase of the reference input while the old active clock circuit follows the phase of the new active (old back-up) clock circuit.

BRIEF DESCRIPTION OF THE DRAWINGS

These and other objects and features, together with the operation and utilization of the present invention, will be more apparent from the illustrative embodiment shown in conjunction with the drawings in which.

GENERAL DESCRIPTION

Before discussing the operation of the clock circuit, it may be helpful to review the context in which such a circuit can be advantageously utilized.

Figure 4:
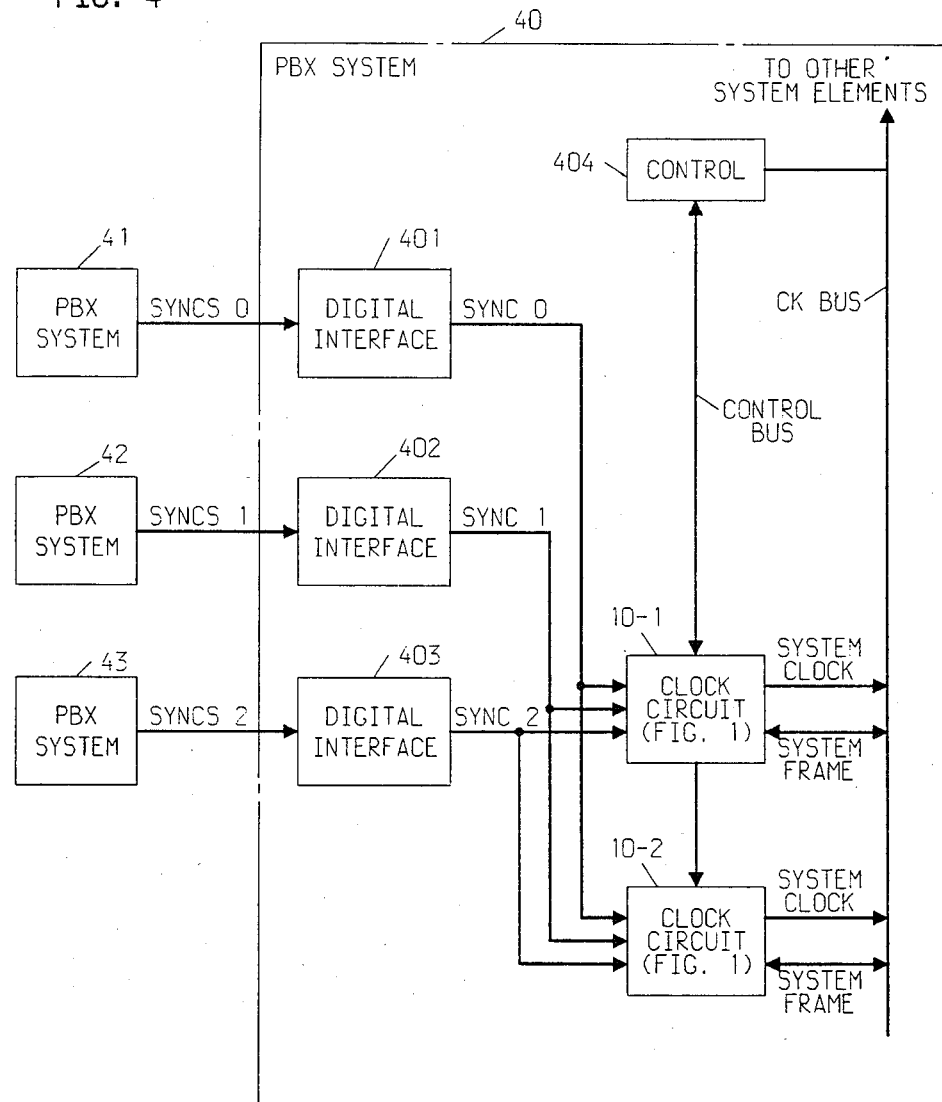
FIG. 4, shows a block diagram of a synchronization system using the clock circuit.

Thus, in FIG. 4, there is shown our clock circuit in conjunction with PBX system 40 which, in turn, is operating in synchronization with PBX 41. PBX's 42 and 43 are also in synchronization with PBX 41 by control signals, which are not shown, which link the PBX's together.

Digital interfaces 401, 402 and 403 of PBX 40 create system signals "sync 0", "sync 1", and "sync 2" which are derived from timing signals received from PBX's 41, 42 and 43, respectively.

The problem is created when it is desired to switch from input reference signal sync 0 to sync 1 to control the timing on PBX system 40's clock bus. This could happen, for example, when PBX 41 is taken out of service for maintenance. In such a situation, if sync 1 was out of phase with sync 0, but of the same frequency, PBX 40 would, if other steps were not taken, immediately detect the phase differences and change the timing on the system bus to adapt to the new phase. This change could create errors in any data transmission which is controlled by the clock signals on that bus.

In prior art systems, this apparent phase error was avoided by continually adjusting the phase of the secondary, or back-up, input reference signal (sync 1), to the phase of the primary input reference signal (sync 0). This is typically accomplished by using phase build-out circuitry for each reference input. For example, see copending patent application G. J. Grimes, Ser. No. 814,541, filed Dec. 30, 1985. Such circuitry, while it performs well, is expensive and consumes valuable physical space. Thus, systems which continually adjust the input signals are economically and physically limited to the number of reference inputs they can switch between. Usually, this number is two; an active input signal and one back-up spare.

Clock circuit 10-1, which is discussed in detail below, allows, as will be seen, for numerous reference input signals without any appreciable increase in processing circuitry. Clock circuit 10-2 is a "hot spare" and is used in the manner to be discussed.

Under normal operation, the phase of the spare clock circuit is fixed to be the same as the phase of the active circuit and, thus, when a change of clock circuits is necessary, no change of output is detected. When it is desired to change reference input signals, the active clock circuit changes the internal loop timing to match the phase of the new reference signal and, again, the output timing on the system clock bus is unaffected.

DETAILED DESCRIPTION

Figure 1:
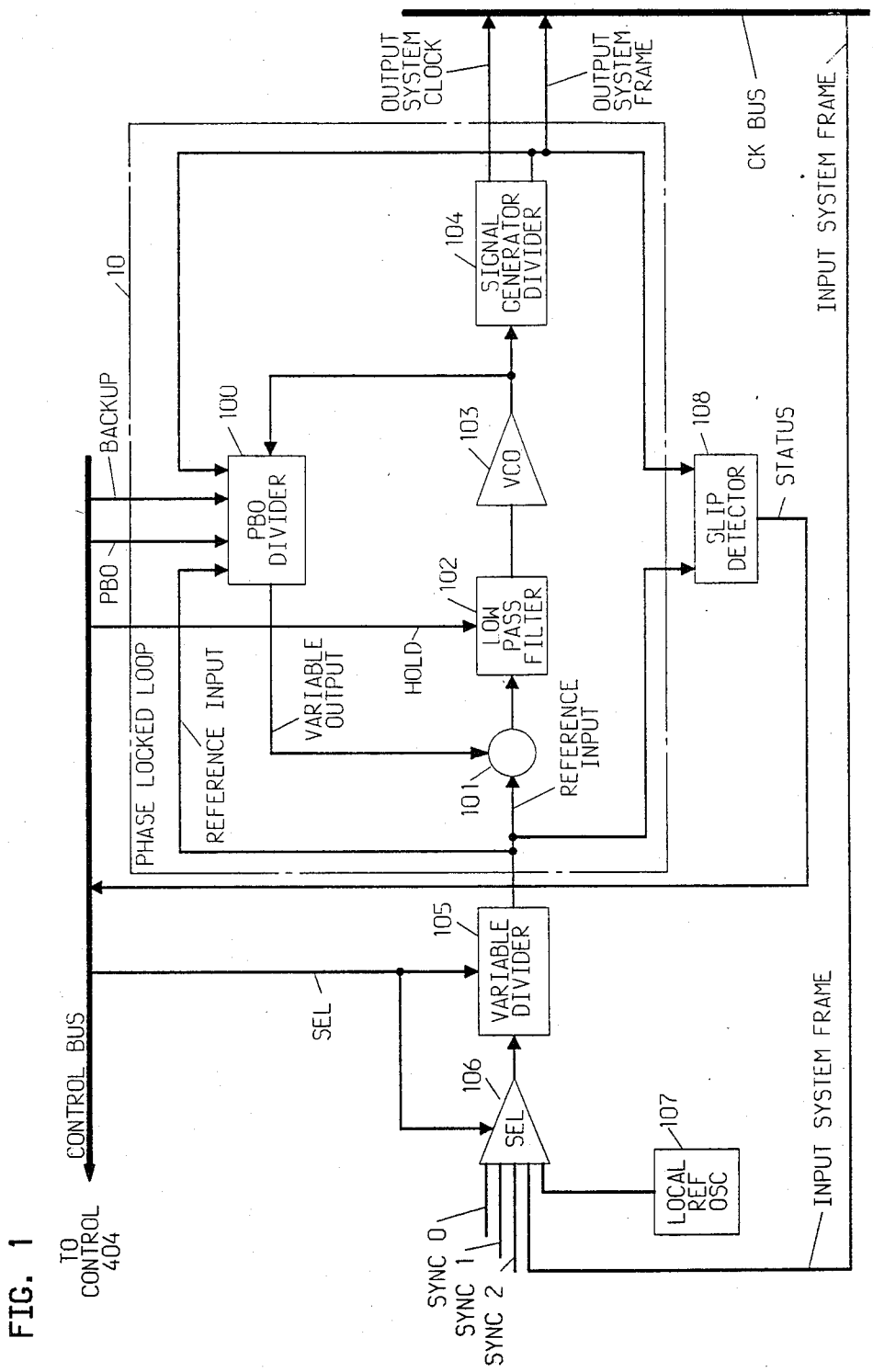
FIG. 1, shows a block diagram of one embodiment of the clock circuit.

Turning now to FIG. 1, there is disclosed one embodiment of our clock circuit. The heart of the clock circuit is dividing phase locked loop 10 which includes blocks 100-104. Phase comparator 101, which can be any standard phase comparator used in phase locked loop circuits, compares the VARIABLE OUTPUT signal from phase build-out circuit 100 with the REFERENCE INPUT signal, and adjusts its output to compensate for differences in phase. When the loop is in phase (in-lock), the output of comparator 101 is constant and the VARIABLE OUTPUT signal is locked in phase (and frequency) to the REFERENCE INPUT signal.

Low pass filter 102, operating on changes in signal from comparator 101, controls the time constant of the phase locked loop. A long time constant is desirable to filter out unwanted frequency excursions on the incoming line. The signal "HOLD" is a frequency holdover control that temporarily freezes the output voltage without regard to phase comparator 101. Such function is useful for maintaining the system clock during outages of the selected synchronization reference.

The output of filter 102 is a D.C. voltage that controls a voltage controlled oscillator (VCO) 103 which is of higher frequency than the REFERENCE INPUT signal. Phase build-out (PBO) divider 100 divides the VCO output to create the VARIABLE OUTPUT signals that is of the same frequency as the REFERENCE INPUT signal. The output signal of VCO also feeds signal generator divider 104 to generate the OUTPUT SYSTEM CLOCK signal and OUTPUT SYSTEM FRAME signal on the respective buses.

Typically, the system output clock rate is greater than the system frame rate. In situations where, as is also very typical, the output clock rate is greater than the reference input rate, but where different reference inputs are not required, there would be used a loop divider circuit between the input and the output to insure the proper frequency relationship between the two signals.

Circuit 10 operates in three modes, (1) the normal mode, (2) the phase build-out mode, and (3) the backup mode.

In the normal mode, the circuit is phase locked to an incoming reference signal, as discussed above. Selector 106 is controlled by signals from control 404 (FIG. 4) over bus SEL to pick from any of the incoming references (synchronization), leads sync 0, sync 1 and sync 2 for slave timing to another system or from local reference oscillator 107 for source timing, or from signals on the input system frame lead.

Variable divider 105 is also controlled by signals on bus SEL and divides the selected REFERENCE INPUT signal by a value selected by the controller 404 (FIG. 4) to match the known input signal frequency to that of the reference frequencies expected by phase comparator 101. The input reference frequency to SEL 106 is required to be either at that frequency or at some multiple of that frequency.

Phase build-out divider 100 combines phase build-out with the required divider chain to form a phase locked loop. When a new input reference source is selected, the input PBO signal from control 404 (FIG. 4) causes PBO divider 100 to align, in the manner to be more fully discussed hereinafter, the phase of the VARIABLE OUTPUT signal to that of the newly selected REFERENCE INPUT signal. Thus, PBO 100 accommodates a new reference phase without requiring VCO 103 and, thus, the output system clocks to adjust. Using this circuit, the internal control signals of the clock circuit are modified during a change of input references as opposed to the change of either the reference signal itself or the output clock signal. This efficiently produces the phase build-out function allowing for minimal phase error when a switch is made between two input reference signals that are of the same frequency.

The OUTPUT SYSTEM FRAME signal is also internally fed to slip detector 108 to be compared to the REFERENCE INPUT signal. Slip detector 108 can make a judgment on the quality of the loop timing and can report the results to control 404 (FIG. 4) using the STATUS output signal. This monitoring function can be used as a trigger to engage the holdover function of filter 102 or to switch from one synchronization reference input to another or to switch to the local oscillator. The operation of slip detector 108 is shown in copending patent application C. Lanzafame B. S. Moffitt, Ser. No. 849,259, filed Apr. 7, 1986.

Figure 2:
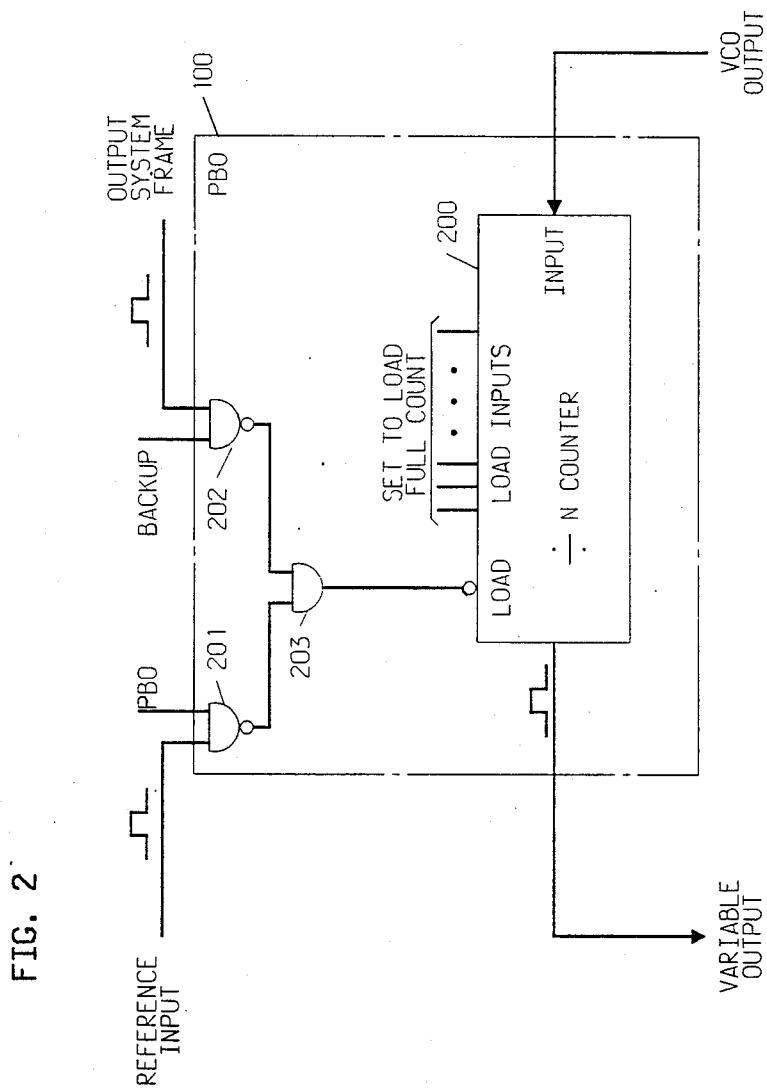
FIG. 2, shows details of one embodiment of the phase build-out divider of FIG. 1.

FIG. 2 shows one embodiment of PBO divider 100. Counter 200 is a standard loadable, divide-by-n, ripple-carry-out counter, where the value of n is determined by the frequency of the output of VCO 103 (FIG. 1) in conjunction with the desired VARIABLE OUTPUT signal frequency. The load inputs of counter 200 are set to a preset number for loading that number into the counter when the signal on the LOAD input goes low. The number set corresponds to n. Assume a VARIABLE OUTPUT signal of 8 Khz and an input signal on VCO output lead of 2.048 Mhz, then n would equal 256.

When it is desired to switch from one reference input to another, the PBO input lead goes high and the LOAD input is strobed under control of the REFERENCE INPUT signal via gates 201 and 203. This effectively resets the counter and forces the phase of the VARIABLE OUTPUT signal to match the phase of the newly selected synchronization REFERENCE INPUT signal. Thus, upon a change of input references, the only signal change occurs within PBO 100 and, since signals REFERENCE INPUT and VARIABLE OUTPUT are forced to be in phase, phase comparator 101 (FIG. 1) does not detect any difference in phase, and the output of VCO 103 remains fixed in phase.

Figure 3:
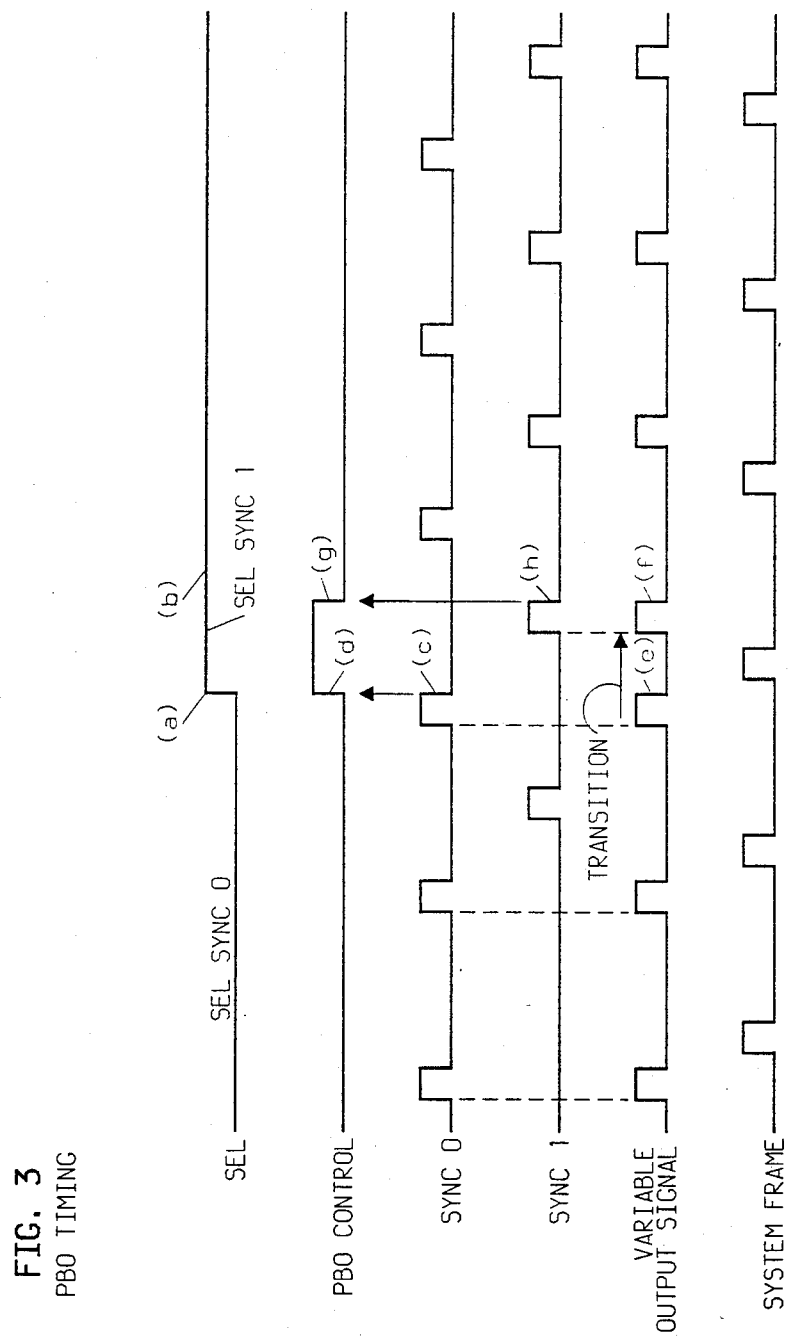
FIG. 3, illustrates a series of waveforms describing the timing of the phase build-out function of the clock circuit.

As shown in FIG. 3, the signal SEL is the signal that selects between the reference input signals to provide the reference to phase comparator 101 of FIG. 1. In the time before point (a), the signal sync 0 is the selected REFERENCE INPUT signal. In the time after point (a), the signal sync 1 is the selected REFERENCE INPUT signal.

At some undetermined time before point (a), control 404 has determined to switch from sync 0 to sync 1. When the falling edge of sync 0 is detected (point c), control 404 uses the select signal SEL (point a) to select sync 1 and uses the PBO signal (point d) to put PBO divider 100 in the build-out mode. In this mode, PBO divider 100 forces the phase of the variable signal to be aligned (point f) with the newly selected reference input signal sync 1. This is accomplished by strobing the LOAD lead of PBO 100 at point h. The effect of strobing the LOAD lead is to phase align the VARIABLE OUTPUT signal to the newly selected REFERENCE INPUT signal tnereby eliminating phase error jitter during the switchover. The PBO mode ends (point g) when the falling edge (point h) of sync 1 is detected. Since, as discussed above, the VARIABLE OUTPUT signal has been moved in phase to match the REFERENCE INPUT signal, the output of comparator 101 remains constant thereby maintaining the output of VCO constant. Thus, the circuit does not have phase discontinuity as it would have had without adjustment of the input phase.

Returning to FIG. 2, when a "hot spare" is used, it is necessary to switch between clock circuits. This is controlled by a signal on lead BACK-UP, as well as a signal on lead SEL (FIG. 1) to selector 106 to select the INPUT SYSTEM FRAME signal as a reference input. The signal on lead BACK-UP remains high for the clock circuit which is the spare and, as will be seen, eliminates counter 200 from affecting the frequency or phase of signals passing therethrough. This, of course, then forces the VARIABLE OUTPUT signal to have the same phase as does the OUTPUT SYSTEM FRAME signal and not, as before, the same phase as the REFERENCE INPUT signal. Since, at this point, the circuit is in the BACK-UP mode, the fact that the OUTPUT SYSTEM FRAME signal continues to vary to meet the REFERENCE INPUT signal (which is now the INPUT SYSTEM FRAME signal from the other "active" clock circuit (not shown)), is not a problem as this signal is typically blocked by an output buffer (not shown) controllable by control 404 to switch between the active and BACK-UP clock circuits.

When the BACK-UP signal is high, the OUTPUT SYSTEM FRAME signal strobes the LOAD input via gates 202 and 203 effectively causing the VARIABLE OUTPUT signal to match the OUTPUT SYSTEM FRAME signal. During this period, signal generator divider 104 (FIG. 1) provides the necessary divider of the feed back loop, and the phase comparator 101 locks the phase of OUTPUT SYSTEM FRAME to the VARIABLE OUTPUT signal and, because of the phase locked loop, also to the REFERENCE INPUT signal.

CONCLUSION

While our circuit has been shown in conjunction with a PBX, it is, of course, obvious to one skilled in the art that the concepts disclosed can find wide application in situations where slave timing or synchronization is necessary and certainly in any digital switching or transmission system. It is also well-known that any number of different internal arrangements for phase and frequency control can be employed without violating the spirit and scope of our invention.

What is claimed is:

1. A clock control circuit for use in situations where it is desired to generate stable timing signals keyed to the phase angle of a plurality of input reference frequency locked signals, said circuit comprising, means for receiving and selecting between said plurality of input signals, means for comparing the phase of a selected input signal with the phase of an internally generated signal, means controlled by mismatches between said phase comparison for adjusting said internally generated signal until said mismatches disappear, means, including said last-mentioned means, for generating said timing control signals from said selected input signal, means controlled by said selecting means and the selection of a new input signal for modifying the phase angle of said internally generated signal to equal the phase angle of said new input signal without modifying said timing signals.

2. The invention set forth in claim 1 wherein said adjusting means includes a feedback loop and wherein said modifying means includes means for changing the phase angle of signals on said feedback loop.

3. The invention set forth in claim 2 wherein said adjusting means includes a counter having an input for accepting a feedback control signal and wherein an output of said counter is said internally generated signal, said counter having means jointly responsive to said selecting means and to said newly selected input signal for immediately resetting the count of said counter thereby forcing said internally generated signal to be in phase with said new input signal.

4. The invention set forth in claim 3 wherein said adjusting means includes voltage controlled oscillator means responsive to the output of said comparing means for providing said feedback control signal to said counter.

5. The invention set forth in claim 4 wherein said adjusting means includes a signal divider circuit for producing said control signals as well as framing control signals.

6. The invention set forth in claim 1 wherein said adjusting means includes a counter having an input for receiving a feedback control signal and wherein said output of said counter is said internally generated signal, said counter having means jointly responsive to a clock changing signal and to said timing control signal for immediately resetting the count of said timer thereby forcing said internally generated signal to be in phase with said timing control signal.

7. A control circuit for use in a PBX system for controlling the timing of data on a data bus such that said data is in phase synchronization with reference signals received from said other PBX systems, said control circuit comprising means for selecting a first one of said reference signals, means for generating a data bus timing signal having a phase identical with said selected first reference signal, means, including a feedback signal having a phase related to said phase of said generated data bus timing signal, for locking said phase of said generated data bus timing signal to the phase of said selected first reference signal, means for selecting a second one of said reference signals while said bus timing signal is locked to said first selected reference signal, means for changing said locking of said bus timing signal from said first reference signal to said selected second signal, said changing means including means for momentarily forcing said phase of said feedback signal to be identical with the phase of said selected second signal so that said phase of said bus timing signal does not change at the instant of said changeover.

8. The invention set forth in claim 7 wherein said feedback circuit includes a resettable counter operable under joint control of said changing means and said selected second reference signal.

9. The invention set forth in claim 8 wherein said locking means further includes
  means for producing an output control signal when the phase between said selected reference signal and said feedback signal is different.

10. The invention set forth in claim 7 wherein said control circuit further includes
  means for monitoring the phase and frequency difference between said selected reference signal and said timing control signal,
  means for selecting a new input reference signal in response to a detected phase or frequency change of a certain magnitude.

11. The invention set forth in claim 9 wherein said PBX has a second control circuit and wherein one of said control circuits operates in the primary mode and the other of said control circuits operates in the backup mode, each said circuit including
  means for selecting one of said control circuits as said backup circuit,
  means for forcing said phase of said feedback signal of said selected back-up circuit to be identical with said phase of said timing control signal of said control circuit which has not been so selected.

* * * * *